(12) United States Patent
Branton et al.

(10) Patent No.: US 7,524,431 B2
(45) Date of Patent: *Apr. 28, 2009

(54) LIFT-OFF PATTERNING PROCESSING EMPLOYING ENERGETICALLY-STIMULATED LOCAL REMOVAL OF SOLID-CONDENSED-GAS LAYERS

(75) Inventors: Daniel Branton, Lexington, MA (US); Jene A. Golovchenko, Lexington, MA (US); Gavin M. King, Boulder, CO (US); Warren J. MoberlyChan, Concord, MA (US); Gregor M. Schürmann, Neuchâtel (CH)

(73) Assignee: President and Fellows of Harvard College, Cambridge, MA (US)

( * ) Notice: Subject to any disclaimer, the term of this patent is extended or adjusted under 35 U.S.C. 154(b) by 775 days.

This patent is subject to a terminal disclaimer.

(21) Appl. No.: 11/008,438

(22) Filed: Dec. 9, 2004

(65) Prior Publication Data

US 2007/0128357 A1    Jun. 7, 2007

(51) Int. Cl.
*C23C 14/34* (2006.01)
*B82B 3/00* (2006.01)

(52) U.S. Cl. .................. 216/41; 216/58; 219/121.2; 204/192.34; 204/192.35; 427/585; 427/331; 427/372.2; 427/532; 427/551; 427/552; 427/553; 427/555; 977/856; 977/857; 977/888; 977/890; 977/891

(58) Field of Classification Search .............. 216/41
See application file for complete search history.

(56) References Cited

U.S. PATENT DOCUMENTS

| 4,348,473 | A | 9/1982 | Okumura et al. |
| 4,535,023 | A | 8/1985 | Whitlock |
| 6,014,259 | A | 1/2000 | Wohlstadter |
| 7,238,294 | B2 | 7/2007 | Koops et al. |
| 2007/0134420 | A1 | 6/2007 | Koberstein et al. |
| 2007/0262050 | A1 | 11/2007 | Golovchenko et al. |

FOREIGN PATENT DOCUMENTS

| DE | 43 18 663 C1 | 10/1994 |
| EP | 0 233 747 A2 | 8/1987 |
| WO | WO 03/088340 A2 | 10/2003 |

(Continued)

OTHER PUBLICATIONS

Johnson et al., "Condensed Gas, In Situ Lithography," IBM Technical Disclosure Bulletin, vol. 20, No. 9, pp. 3737-3738, Feb. 1978.

(Continued)

*Primary Examiner*—Anita K Alanko
(74) *Attorney, Agent, or Firm*—Theresa A. Lober

(57) ABSTRACT

The invention provides a method for forming a patterned material layer on a structure, by condensing a vapor to a solid condensate layer on a surface of the structure and then localized removal of selected regions of the condensate layer by directing a beam of energy at the selected regions, exposing the structure at the selected regions. A material layer is then deposited on top of the solid condensate layer and the exposed structure at the selected regions. Then the solid condensate layer and regions of the material layer that were deposited on the solid condensate layer are removed, leaving a patterned material layer on the structure.

57 Claims, 3 Drawing Sheets

FOREIGN PATENT DOCUMENTS

| WO | WO 2004/079450 A1 | 9/2004 |
|---|---|---|
| WO | WO 2007/044035 A1 | 4/2007 |

OTHER PUBLICATIONS

Brown et al., "'Sputtering' of Ice by MeV Light Ions," Phys. Rev. Lett., vol. 40, No. 15, pp. 1027-1030, Apr. 10, 1978.

Brown et al., "Linear and Nonlinear Processes in the Erosion of H20 Ice by Fast Light Ions," Phys. Rev. Lett., vol. 45, No. 20, pp. 1632-1635, Nov. 17, 1980.

"Laser-Induced Sublimation of GaAs For Semiconductor Masks," IBM Technical Disclosure Bulletin, vol. 31, No. 7, pp. 34-35, Dec. 1988.

"Selective Deposition With 'Dry' Vaporizable Lift-off Mask," IBM Technical Disclosure Bulletin, vol. 35, No. 1A, pp. 75-76, Jun. 1992.

King et al., "Nanometer Patterning with Ice," Nano Letters, vol. 5, No. 6, pp. 1157-1160, Jun. 2005.

Gutzow et al., "On the mechanism of formation of amorphous condensates from the vapour phase, (I), General theory," Jnl. of Non-Crystalline Solids, vol. 16, pp. 128-142, 1974.

Hobbs, "Ice Physics," pp. 1, 52, 53, Oxford University Press, London, 1974.

Sack et al., "Sublimation of vapor-deposited water ice below 179 K, and its dependence on growth conditions," Physical Review B, Third Series, vol. 48, No. 14, pp. 9973-9978, Oct. 1, 1993.

Debenedetti, "Supercooled glassy water," J. Phys.: Condens. Matter, vol. 15, pp. R1669-R1726, 2003.

Safarik et al., "Thickness dependent crystallization kinetics of sub-micron amorphous solid water films," Jnl. of Chemical Physics, vol. 118, No. 10, pp. 4660-4671, Mar. 8, 2003.

Angell, "Amorphous Water," Annual Rev. Phys. Chem., vol. 55, pp. 559-583, Feb. 3, 2004.

Chaplin, "Amorphous Ice and Glassy Water," taken from "Water structure and Science," http://www.Isbu.ac.uk/water/amorph.html, updated Dec. 10, 2007.

Chaplin, "Water Phase Diagram," taken from "Water Structure and Science," http://www.Isbu.ac.uk/water/phase.html, updated Jan. 18, 2008.

USPTO Examiner Action, U.S. Appl. No. 11/008,402, filed Mar. 22, 2007.

Applicant response to USPTO Examiner Action, U.S. Appl. No. 11/008,402, filed Apr. 18, 2007.

USPTO Examiner Action, U.S. Appl. No. 11/008,402, filed Oct. 1, 2007.

Response to Examiner Action, U.S. Appl. No. 11/008,402, filed Feb. 21, 2008.

Examiner Interview Summary, U.S. Appl. No. 11/008,402, filed Feb. 26, 2008.

Mednikarov, "Dependence of the dissolution characteristics of As2S3 as a photoresist on the condensation rate and evaporation temperature," Jnl. of Vacuum Science and technology, Part B, V. 7, N. 3, pp. 561-564, May 1989.

US 7,524,431 B2

LIFT-OFF PATTERNING PROCESSING EMPLOYING ENERGETICALLY-STIMULATED LOCAL REMOVAL OF SOLID-CONDENSED-GAS LAYERS

STATEMENT REGARDING FEDERALLY SPONSORED RESEARCH

This invention was made with Government support under Contract No. F-49620-01-1-0467, awarded by DARPA and under Contract No. DE-FG02-01ER45922, awarded by DOE. The Government has certain rights in the invention.

CROSS-REFERENCE TO RELATED APPLICATION

This patent application is being concurrently filed with U.S. patent application Ser. No. 11/008,402, entitled "Energetically-Stimulated Local Removal of Solid-Condensed gas Layers and Solid State Chemical Reactions Produced with Such Layers," by Golovchenko et al., issued as U.S. Pat. No. 7,435,353, published as US 2007/0128357, the disclosure of which is hereby incorporated by reference.

BACKGROUND OF THE INVENTION

This invention relates to controlled removal of solid state materials and further relates to patterned formation of materials.

Modern solid state microfabrication technologies have evolved to encompass the production of microstructures and nanostructures for both electronic and microelectromechanical (MEMS) systems. Exotic substrate and component materials are increasingly employed in complicated three-dimensional system arrangements. Historically and conventionally, the building blocks of microfabricated system componentry have been produced by imparting patterns to solid state structures and by imposing selective chemical processes, such as impurity doping, material removal, and material growth, on solid state materials. The term "solid state" is here used to refer to non-biological materials generally.

In the production of both electronic and MEMS systems, nanometric feature control of solid state structures is increasingly becoming a microfabrication concern. In addition, selective material deposition and processing of unconventional solid state materials and structures, often arranged in intricate configurations, is increasingly becoming a microfabrication challenge. There have been established a wide range of microfabrication techniques for producing and controlling structural dimensions and material patterning on solid state materials. For example, high resolution lithographic techniques and high-precision additive and subtractive material processing techniques have been proposed to enable small-scale feature fabrication. But in the fabrication of many micro- and nano-regime systems, in which structural feature dimensions of a few nanometers can be of importance and in which exotic materials and intricate structural configurations are often employed, conventional techniques often cannot form the requisite nano-scale features reproducibly or without harming system materials, and often cannot provide selective chemical processing of the materials predictably or without harming system materials. As a result, volume manufacture of many systems that include microscale or nanometric feature dimensions and/or unconventional materials and configurations is not practical or economical.

SUMMARY OF THE INVENTION

The invention overcomes limitations of conventional lithographic techniques in providing a method for forming a patterned material layer on a structure. In the method, a vapor is condensed to a solid condensate layer on a surface of the structure and then selected regions of the condensate layer are locally removed by directing a beam of energy at the selected regions, exposing the structure at the selected regions. A material layer is then deposited on top of the solid condensate layer and the exposed structure at the selected regions. Then the solid condensate layer and regions of the material layer that were deposited on the solid condensate layer are then removed, leaving a patterned material layer on the structure.

The patterning technique of the invention does not require liquid spinning or baking, and does not require photoresist development steps. This eliminates the need for solvents, and inhibits deleterious device effects, due to, e.g., liquid flow, contamination, and surface tension, that are commonly a challenge for liquid processing of micro- and nano-scale structures. Other features and advantages of the invention will be apparent from the following description and accompanying figures, and from the claims.

DETAILED DESCRIPTION OF THE INVENTION

Figure 1A:
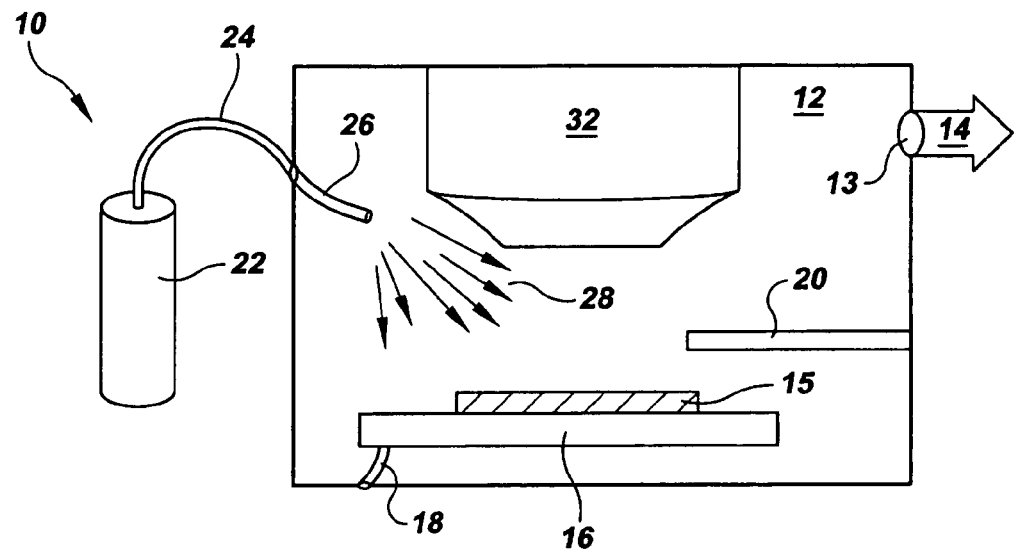
FIGS. 1A-1E are schematic views of a processing chamber and associated elements provided by the invention for forming a solid condensate layer and for enabling lift-off patterning of a material layer with the solid condensate layer.

Referring to FIG. 1A there is shown a schematic view of a system 10 for carrying out the techniques provided by the invention for lift-off patterning with a solid-condensed-gas layer. The system 10 includes a chamber 12 having a pump port 13 for pumping the chamber to a desired pressure by delivery 14 to, e.g., a vacuum pump. A structure 15 to be processed in accordance with the invention is provided on a structure holder 16. In the example configuration shown in FIG. 1A the structure 15 is illustrated as a planar substrate, but such is not required by the invention; as discussed in detail below, three-dimensional structures in a wide range of configurations can be employed. The structure holder 16 is provided with a suitable connection 18 to enable electrical and thermal control of the structure, e.g., for cooling the structure. Additional thermal control elements can be provided in the chamber 12. For example a conventional cold finger 20 can be positioned for pumping the chamber in the immediate vicinity of the structure.

Figure 1B:
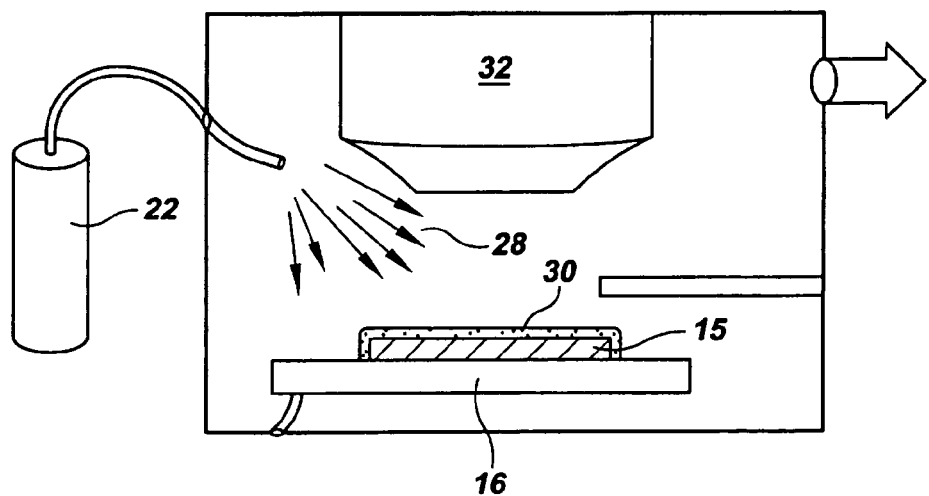

Referring also to FIG. 1B, a source 22 is attached through a connection 24 to an injector 26 for providing a vapor 28 that condenses directly to a solid condensate layer 30, that is, a layer of solid-condensed-gas. As shown in FIG. 1B, the conditions of the chamber are set such that the solid-condensed-gas layer forms on the structure 15. Solid-condensed-gas may also form on other parts of the chamber as well, but for the purposes of the invention, solid condensate formation on the structure 15 is all that is required.

Figure 1C:
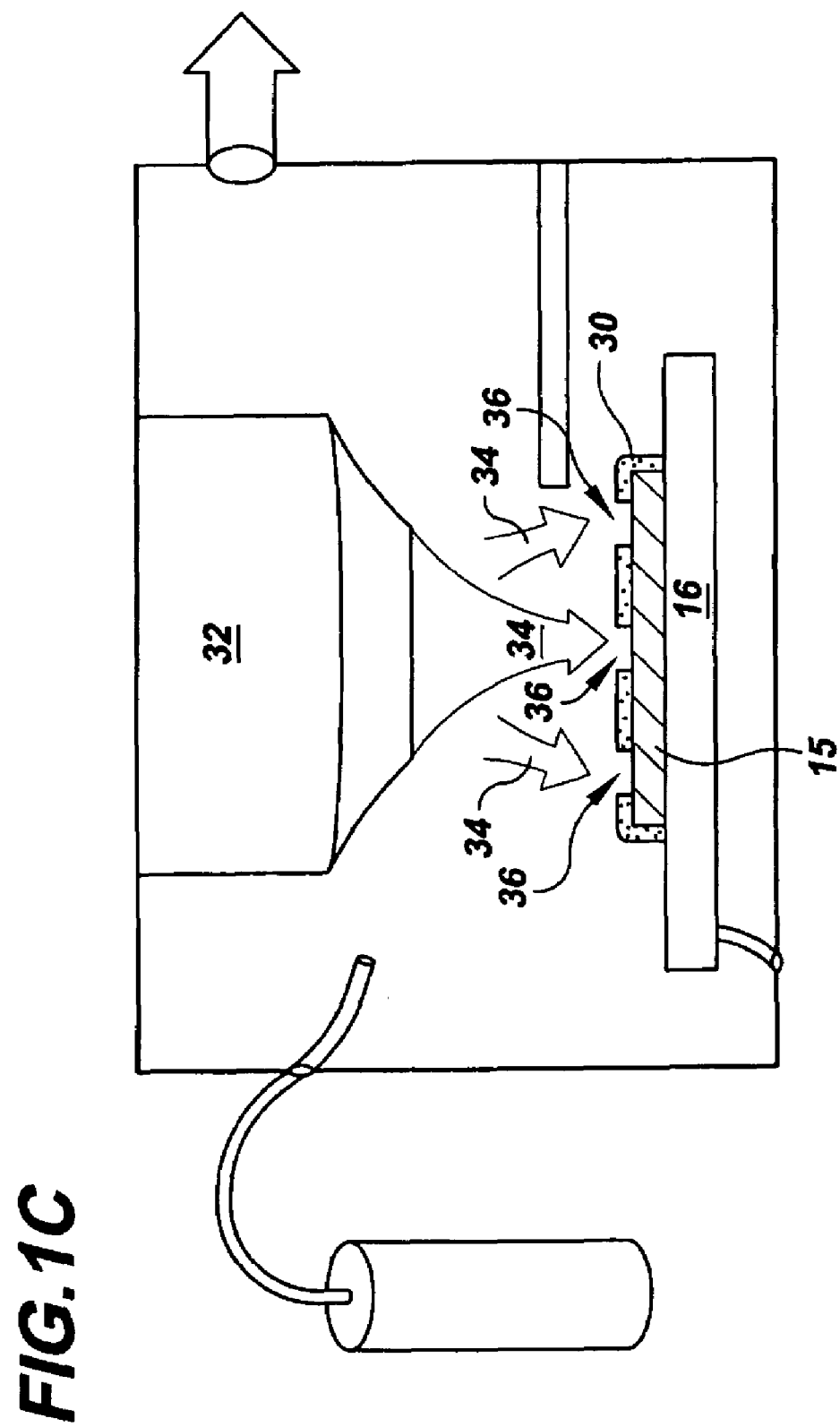

Referring also to FIG. 1C, the chamber 12 is provided with one or more sources 32 of an energetic beam 34 or beams that can be controllably directed to locations of interest 36 on the solid condensate layer 30. The energetic beam 34 is controlled, under the chamber conditions, to cause the solid condensate 30 to be removed locally, only at the locations of interest to which the beam is directed. The beam stimulates local removal of the solid condensate. As explained in detail below, in this removal process, the solid condensate can be converted from the solid phase to the gas phase by the energetic beam. In one technique provided by the invention, the stimulated local removal of the solid condensate layer 30 by the energetic beam 34 is continued until the structure 30 is exposed under the condensate layer at the locations to which the beam is directed. While the solid condensate layer is being removed and after the layer is removed, processing of the structure can be carried out. Then, the remaining solid condensate layer portions are removed by any of a number of techniques, and preferably are removed by converting the layer from the solid phase back to the gas phase. Aspects of each of these process techniques are described in detail below.

First considering the characteristics of solid condensate layer in more detail, such is formed in accordance with the invention by the condensing of a vapor to the solid phase. The originating source 22 of the vapor can be one or more solid, liquid, vapor-phase gas, vapor, gas, or other constituents or a combination of constituents. All that is required is the delivery of a vapor 28 to the process chamber 12 for condensation on a structure 15 in the chamber. For example, atomization, sublimation, or sputtering techniques, or other suitable solid, liquid, or vapor phase chemical processing can be employed for producing the vapor to be condensed.

The constituents of the vapor to be condensed are selected based on the characteristics of the structure, the energetic beam to be employed for stimulated local removal of the solid condensate layer, and any processing of the structure to be carried out with the solid condensate in place on the structure. It is preferred in accordance with the invention that the solid-condensed-gas layer be removed from the structure by conversion from the solid phase to the gas phase. Given that the solid-condensed-gas layer is also formed by conversion from the gas phase to the solid phase, high vapor pressure materials can be good candidates for the condensate.

In one example in accordance with the invention, the vapor source 22 includes a source of water vapor to enable production of vapor 28 in the chamber that includes, or alternatively that is composed substantially entirely of, water vapor. Because of the wide availability, low cost, ease of handling, and other positive attributes of water, such can be a preferred vapor candidate for many applications. Water vapor can be condensed from the vapor phase to the solid phase under appropriate temperature and pressure conditions, can be selectively locally removed by stimulated interaction with an energetic beam, and can be converted from the solid phase back to the vapor phase without production of residue or contaminants. Water vapor thereby enables production of a solid condensate layer that can be easily and controllably formed as well as removed.

Referring back to FIG. 1A, in an example process provided by the invention for producing a solid-condensed-gas layer from water vapor, a source 22 of water vapor, e.g., liquid water, Epsom salts, sulfate, or other high vapor pressure solid that can vaporize, or other vapor source, is provided. The injector 26 to the chamber can here be provided as, e.g., a simple leak valve, a mass flow controller, or other suitable injector. For the controlled production of thin solid condensate layers from water vapor, it can be preferred to control introduction of the water vapor. Given that the injector may include a tube nozzle that produces directional vapor injection, a highly controllable valve or other controller can be preferred along with a diffuser or other device for enabling diffusivity of vapor introduction to the chamber.

It is found that the proximity of the vapor injector of the chamber to a structure in the chamber on which a solid condensed layer is to be formed can impact the solid condensate formation. Specifically, it is found that shadowing and point source effects can occur for close injector proximities. It is therefore preferred that the scale of the structure be considered relative to the distance from the structure holder to the chamber injector. A relatively larger distance can be preferred for larger structure surfaces, with the injector and/or structure holder positioning adjusted accordingly. In addition or alternatively, parallel vapor sources, e.g., shower head arrangements, can be employed.

Continuing with the example process for producing a solid-condensed-gas layer from water vapor, the structure of interest 15 is provided on the sample holder 16 and connection 18 is made for enabling electrical grounding of the sample for applications in which a charged energetic beam species is to be employed. For applications in which an electrically charged energetic beam species is employed, it can be preferred to make such an electrical connection, rather than electrically isolating the sample, to enable draining of the energetic beam species charge from the sample. The structure holder 16 is then thermally controlled to regulate the structure temperature for applications in which such local cooling is preferred. Accordingly, it can be preferred for many applications to ensure that the structure makes good thermal, electrical, and mechanical contact with the structure holder. Double-sided carbon tape, silicon grease, or other aid can here be employed.

The structure temperature is regulated based on the solid condensate species selected. In the example employing water vapor, the structure temperature is held below a temperature at which the water vapor condenses to form a solid ice condensate layer. For many applications, it can be preferred to maintain the structure temperature at 180 K or less, and more preferably to maintain the structure temperature at 130 K or less to enable formation of a uniform, smooth, and conformal solid ice condensate layer. This particular temperature range is not required by the invention, however. Rather, the invention requires that the temperature be maintained no higher than that temperature at which a solid condensate layer, e.g., an ice layer, sublimes to vapor so rapidly that the layer is completely removed before an energetic beam can cause the solid condensate to be removed locally.

As explained below, solid condensate layer characteristics of uniformity, smoothness, and conformality, typically ascribed to an amorphous, vitreous layer, can be preferred for enabling optimal coverage of the structure and for enabling precise control of local removal of the solid condensate by an energetic beam. The process chamber can be maintained at room temperature, with the structure holder controlling the substrate temperature, and/or the chamber itself can be employed to cool the structure. Local temperature regulation of the sample can be preferred for enhancing control of such. Where the structure holder is employed to regulate the structure temperature, a cryostage or other cryogenically-cooled structure holder can be preferred for enabling structure temperatures in the 100 K range.

As shown in FIG. 1A, a cold finger 20 can also be employed for controlling the temperature local to the structure. Such a cold finger is not required, particularly where the process chamber is known to be quite clean. Otherwise, it can be preferred to employ a cold finger to attract stray water, hydrocarbons, and other contaminants in the chamber. The cold finger is here preferably set at a temperature that is less than that of the structure so that the net flux of contaminants is greater onto the cold finger rather than the structure. For the water vapor example here, with a structure temperature set at less than about 130 K for condensation of the water vapor, a cold finger temperature of about 77 K, produced by liquid nitrogen cooling, can be preferred. The cold finger can be positioned quite close to the structure holder, and preferably is set as close as possible to the structure.

In addition to thermal control, there is required the control of the pressure of the vapor in the vicinity of the structure on which a solid condensate layer is to be formed. The background pressure of the process chamber is not in general as important as the pressure local to the structure, which more closely dictates the solid condensate formation. Specifically, it is found that the local pressure directly impacts the solid condensate formation characteristics and rate. For example, it is found that uniform, smooth, conformal solid ice condensate layers can be formed from water vapor when the condensate layer is produced at a rate less than about 25 nm/sec. Given a structure temperature less than about 130 K, a local pressure that is less than about $10^{-4}$ T can be employed for achieving this solid condensate formation rate. It is recognized in accordance with the invention that before a vapor is introduced into a chamber for solid condensate formation, it can be preferred to impose a base chamber pressure to assure a relatively clean vacuum environment from which no or only a few unwanted molecules may condense during the vapor condensation. For the example process employing water vapor, a pressure less than about $10^{-6}$ T can be preferred as such a base chamber pressure. Once this base pressure is reached, a selected condensation pressure can then be imposed based on the vapor species and other characteristics. For the example of water vapor condensation, a condensate formation pressure higher than the base pressure, e.g., between about $10^{-4}$ and $10^{-6}$ can be preferred for many applications. Continuing with the example employing water vapor, once the structure temperature has been regulated to less than about 180 K and the pressure local to the structure has been regulated to a selected pressure, e.g., less than about $10^{-4}$ T, injection of the water vapor to the chamber can commence. As the water vapor enters the chamber, a pressure gauge or other monitoring device can be employed to follow the vapor injection. It can be preferred to employ a pressure gauge that can monitor the pressure local to the structure. In general, empirical calibration of the chamber conditions can be employed to relate solid condensate formation rate with a pressure reading. The solid-phase condensation of the water vapor can also be monitored in situ, during the solid condensate formation, with electron beam imaging of the structure. Referring back to FIG. 1A, the beam source 32 can be adapted to accommodate an electron beam apparatus, e.g., a scanning electron microscope (SEM) apparatus, for scanning the structure as a solid condensate layer is formed and producing a corresponding image of the structure. As the structure is scanned by the electron beam, the secondary electron yield from the structure changes in correspondence with the solid condensate layer formation, and such changes are reflected in the brightness of the structure image. Similarly, IR absorption measurements can be made in situ. These in situ techniques enable real time monitoring of the water vapor condensation process.

It has been found experimentally that solid condensate formation from water vapor onto a silicon substrate held at a temperature of about 128 K and a local pressure of about $10^{-4}$ T results in a solid condensate layer, here termed as a water ice layer, that is stable and does not degrade. It is known that at a temperature of about 128 K, ice sublimes at a rate of only about 0.3 monolayers/hour with a sublimation energy of about 0.45 eV. As a result, so long as the temperature and pressure conditions of the chamber are maintained at the stated levels, the water ice layer is stable and will not significantly sublime or otherwise degrade.

Under the solid ice condensate formation conditions just given it has been found experimentally that the ice condensate is smooth, uniform, and conformal and appears to be amorphous at the resolution of a SEM image. With SEM monitoring of the ice condensate layer while the temperature of the silicon wafer was increased to about 153 K, it was experimentally found that the ice condensate surface image transitioned from a smooth to a granular appearance. This granular transition corresponds to the amorphous-to-cubic ice phase transition temperature of ice, and indicates that maintenance of an ice condensate layer at temperatures below about 130 K can maintain a stable amorphous morphology. It is recognized in accordance with the invention that temperatures above 130 K can be employed where the morphology of the resulting solid ice condensate layer is acceptable.

In accordance with the invention, a solid ice condensate layer can be formed selectively at specific locations of a structure surface, by self-assembly processes. For example, conventional self-assembly processes can be employed to produce arrangements of layered regions on the structure surface that are selectively hydrophobic or hydrophilic. With such an arrangement of hydrophobic and hydrophilic surface regions, condensation of water vapor can be carried out to form a solid ice condensate layer only on the hydrophilic surface regions.

Once the water vapor processing described above is completed to form a solid ice condensate layer of a selected thickness, stimulated local removal of that ice layer can be carried out in the manner described above and explained in more detail below. The remaining ice layer can then be removed, also as explained below.

Turning first to vapor species other than water vapor, the invention contemplates a wide range of alternative vapor constituents. In general, all that is required of the vapor constituents in the production of the solid condensate layer is the conversion from the vapor phase to the solid phase. This criterion can be met for many vapors with chamber temperature and pressure conditions that are practical for many applications. One skilled in the art will recognize that the chamber temperature and pressure can be regulated to produce process conditions that enable vapor-to-solid conversion. It is under these conditions that a selected vapor can be introduced to the vicinity of a structure for solid condensation on the structure.

For example, as explained above with reference to water vapor condensation, at a structure temperature below about 130 K and a local pressure of less than about $10^{-4}$ T, smooth, uniform, conformal, and stable ice condensate layers can be formed. Corresponding pressure-temperature combinations can likewise be determined for other selected vapor species; in other words, the temperature and pressure ranges at which a given vapor species will condense from the vapor phase to the solid phase are identified and the most suitable conditions for a given application are selected. So long as a suitable pressure-temperature combination can be practically implemented for a given application, the corresponding vapor species is a candidate for the solid condensate formation. For example, given the low cost and availability of liquid nitrogen, a pressure-temperature combination that enables vapor-to-solid condensation at liquid nitrogen temperatures can be employed in a corresponding application.

There are a number of other considerations to be made in selection of vapor species. It is to be recognized that in the process of local stimulated removal of a solid condensate layer by an energetic beam, described in detail below, the beam produces a profile of energy that can reach the surface of the structure below the solid condensate layer. This can result in chemical interaction between the condensate layer and the structure. The reactivity of the solid condensate layer as well as that of the structure can also be enhanced by the energy of the beam. Further, reaction of the solid condensate layer with the ambient of the process chamber can be induced by the energy of the beam.

Therefore, if it is desired to minimize or inhibit reactions of the solid condensate layer and/or the structure material, then it can be preferred to employ inert gas species for producing the solid condensate layer. Inert gases, or rare gases, including argon, krypton, zenon, neon, xenon, or radon can be employed. Liquid nitrogen, alcohols, methane, and other vapor species can also be employed.

A further consideration for vapor species selection relates to removal of the solid condensate layer. As described briefly above, once processing of the structure with the solid condensate layer in place is complete, the solid condensate layer is removed, and preferably is removed by conversion back to the vapor phase. The vapor species therefore is preferably selected to produce a solid condensate layer that can be removed by conversion to the vapor phase, e.g., through heating, as in the previous example of condensed water vapor, and as explained in detail below.

Referring back to FIG. 1C, whatever vapor species is selected, once the species is condensed to form a solid condensate layer 30 on a structure 15, an energetic beam 34 is directed to selected locations 36 of the layer 30 to cause stimulated local removal of the layer. To enable application of this local removal process to nanometric dimensions and intricate structural configurations, the uniformity, smoothness, and conformality conditions for the layer described above are preferred. Amorphous layers in general tend to be uniform, smooth, and conformal and thus can be preferred for many applications. But an amorphous morphology is not an absolute requirement of the layer.

It is recognized that interaction of an energetic beam 34 with the solid condensate layer 30 can be crystal orientation-dependent. In addition, removal of the solid condensate layer by conversion to vapor, e.g., by sublimation, can be crystal orientation-dependent, in that the sublimation energy can depend on the crystal orientation. Therefore, if a polycrystalline or crystalline solid condensate layer is required or if an amorphous morphology is not achievable, then it can be preferred for many applications that the crystals of the crystalline morphology be rendered as small as possible.

In accordance with the invention, an energetic beam is directed to selected locations of a solid condensate layer to cause stimulated local removal of the layer. In this process, energy of the beam locally interacts with the layer, resulting in localized layer removal. The beam species for causing this localized removal is therefore preferably selected based on the energy deposition profile and the focusing capabilities of the beam for a given solid condensate species. More specifically, the achievable resolution for a locally removed condensate region is directly impacted by the ability to localize an energetic beam. The beam species, energy, dose, and other characteristics can also be empirically optimized to further enable high resolution.

For many applications an electron beam can be preferred as the energetic beam species. An electron beam can be highly focussed, the energy of the electron beam can be controlled, and the beam can be scanned. As an electron beam interacts with a solid condensate layer, the electron beam can alter the electrical and structural state of the condensate layer by the traversal of electrons through the layer and by the deposit of electrons in the layer. This energetic interaction is understood to be highly localized in that it is substantially electrical, rather than molecular, in nature. As the energetic interaction progresses, the solid condensate is removed at the location of the interaction, e.g., by stimulated erosion, sublimation, ablation, ionization, or other mechanism. The local removal can be continued until, as shown in FIG. 1C, the solid condensate layer 30 is completely removed at the locations of interest 36, exposing the underlying structure 15.

The energy of an electron beam to be directed at a condensate layer is preferably selected based on the thickness of a solid condensate layer under consideration. In general, for a given condensate layer thickness, an increase in electron beam energy results in an increase in the resolution of the stimulated local condensate removal. Accordingly, for a given electron beam energy, a reduction in solid condensate thickness results in an increase in the resolution of the stimulated local condensate removal. An increase in electron beam energy can also, under certain circumstances, enable a higher degree of beam focus. It will be recognized by one skilled in the art that some empirical analysis can be preferred for enabling optimization of electron beam conditions for a given condensate layer thickness.

Considering example experimental results for electron beam-stimulated local removal of a solid ice condensate layer, a solid ice condensate layer of about 75 nm in thickness was produced on a silicon substrate at a temperature of about 128 K and a pressure of about $10^{-4}$ T, employing a water vapor source of Epsom salts. After the ice condensate layer was formed, the substrate was maintained at the 128 K temperature. Thereafter, an electron beam having an energy of 5 KeV and a focus diameter of about 5 nm was directed to and scanned across a 500 nm square location on the ice condensate layer. An electron beam dose of at least about $8.8 \times 10^5$ $\mu C/cm^2$ was required to completely remove the ice condensate layer and expose the underlying silicon surface in the 500 nm square location.

It was found by SEM inspection that the 75 nm-thick ice condensate layer exhibited an amorphous morphology. Assuming that the amorphous ice condensate layer had a density of about 0.91 $gm/cm^3$, the stimulated local removal yield of the ice condensate layer for the 5 KeV electron beam is determined to be about 0.03. In other words, for each incident electron directed to the ice condensate layer, 0.03 ice condensate molecules are removed from the layer. It was found that this removal yield decreases as the electron beam energy is increased. For example, as the beam energy is increased from 1 KeV to 30 KeV, the ice condensate removal yield was experimentally observed to decrease by over an order of magnitude. Conversely, it was experimentally observed that the ice condensate removal yield does not vary significantly as the temperature of the substrate is increased from 128 K to 158 K.

It is of interest to compare the line width resolution that can be obtained by electron beam removal of an ice condensate layer with the line widths that are typically achieved with conventional photoresists such as polymethyl methacrylate (PMMA) and electron beam processing. While minimum line widths of less than 10 nm have been demonstrated with electron-beam exposed PMMA, such results have typically required specialized high energy beams, e.g., beams greater than 100 KeV in energy, and specialized processing, such as ultrasonication during the PMMA development. A line width more typically achieved with electron-beam exposed PMMA on a bulk silicon substrate, with commercial electron beam lithography tools, is on the order of about 30 nm. In contrast, the invention enables electron beam patterning, in the manner of lithography, of an ice condensate layer to produce pattern linewidths of less than 20 nm with relatively low electron beam energies and no specialized equipment.

The invention contemplates a wide range of energetic beam species that can be employed to locally remove a solid condensate layer. For example, ion beams can be employed as the energetic beam species. It is to be noted, however, that the typically relatively large mass and corresponding low speed of ions can cause damage to or ion implantation of a structure underlying a solid condensate layer and/or the condensate layer itself as an ion beam is directed to the layer. The condensate removal yield of an ion beam is found to be substantially greater than that for an electron beam, and thus for applications in which a high removal yield is desired, an ion beam can be preferred. In addition, an inert ion beam would be preferable for applications in which chemical interaction of the beam with the condensate layer and/or the underlying structure is to be minimized.

In one example process provided by the invention for locally removing regions of a solid ice condensate layer having a thickness of 300 nm by an ion beam, a focussed $Ga^+$ ion beam having an energy of 30 KeV, an amperage of 10 pA, and a diameter of about 10 nm removed local solid ice regions with a linewidth as narrow as about 20 nm.

Other candidate beam species include, e.g., atomic beams such as neutral atomic beams, molecular beams, cluster beams, proton beams, alpha particles, X-ray beams, optical beams, and other suitable beam species. Beams that can be highly localized can be particularly advantageous, and the invention contemplates the use of highly focussed beams where applicable. In general, for these or other selected energetic beams, the beam characteristics are selected to cause stimulated local removal of the solid condensate. For example, characteristics such as the wavelength and power of an optical beam can be selected to cause stimulated local removal of a given solid condensate layer. In one example of such a selection, it is recognized that water highly absorbs optical wavelengths less than about 170 nm. Therefore, given a solid ice condensate layer, it can be preferred to employ a relatively low optical wavelength for stimulating local removal of the solid ice condensate layer.

In addition or alternatively, it can be preferable to adjust the beam absorption characteristics of the solid condensate to optimize the ability of a given beam to interact with a layer of the condensate. It is recognized that beam energy can be absorbed differently by differing solid condensate species. Therefore, the solid condensate constituents can be selected to optimize the energy absorption of a given beam species by the condensate. For example, a dye can be added to a solid ice condensate layer to tune the optical absorption properties of the ice layer where an optical beam is to be employed for local removal of the ice layer. Here a water vapor source can be modified to include a dye such that a solid ice condensate layer includes the dye. Similarly, given the use of an electron beam, the constituents of a solid condensate layer can be adjusted to tune the layer's electronic properties such that the electron absorption of the layer is optimized for a given application.

Referring back to FIG. 1C, whatever beam species is employed, the energetic beam 34 can be directed to locations 36 of a solid condensate layer 30 to cause stimulated local removal of the layer. The beam can be scanned to form desired patterns of locally removed regions of the layer. Such patterns can be continuous or discontinuous, and can be produced at various locations of the structure. In addition, multiple beam species can be employed at various locations of the structure and/or at a common location, depending on the removal requirements for a given condensate layer and/or desired removal arrangement.

In accordance with the invention, once the solid condensate layer 30 is removed at local regions of interest, the structure and upper condensate layer are exposed to a source of material to be deposited on the structure for lift-off patterning of the deposited layer on the structure surface. During this material deposition step, the integrity of the solid condensate layer 30 is to be maintained to enable transfer of the locally removed pattern in the condensate layer to the deposited material. For example, given a solid ice condensate layer, it is preferred that the pressure and temperature conditions at which the ice condensate remains a stable amorphous solid be maintained while a material is deposited on the structure and the patterned condensate layer.

Figure 1D:
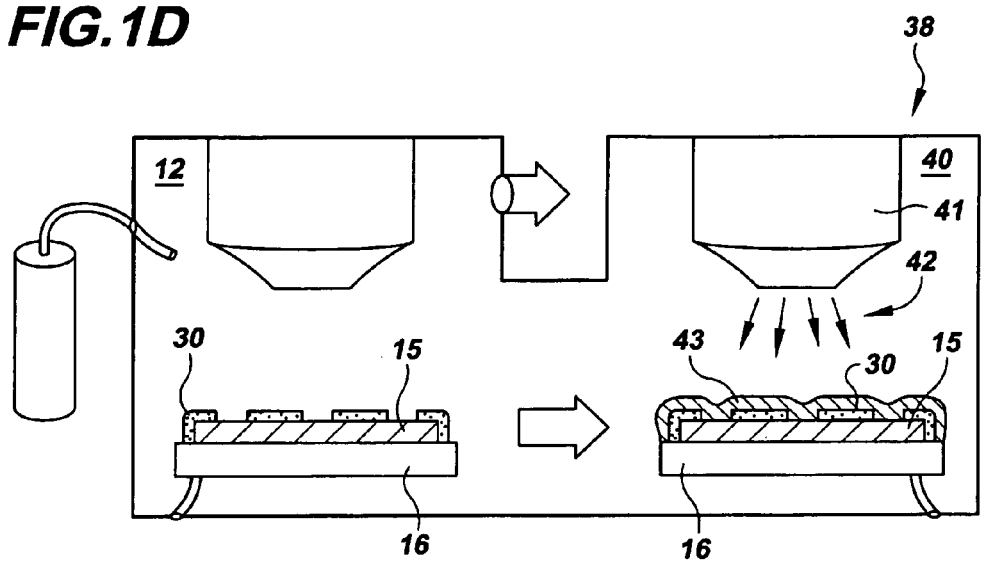

In one example process provided by the invention, a multi-chamber process housing is employed that enables solid condensate formation and processing and material deposition in situ, under constant temperature and pressure conditions. For example, as shown in FIG. 1D, in such a multi-chamber housing, a first chamber 12, like that described above, is provided for enabling solid condensate layer formation and localized removal by an energetic beam. A second chamber 40 is provided in direct connection with the first chamber 12 such that common temperature and pressure conditions can be set for both chambers. In the second chamber, a material deposition source 41, e.g., a sputtering source, is provided to produce vapor phase material constituents 42 for blanket deposition of a corresponding material layer 43 on the structure 15 and patterned solid condensate layer 30.

It is not required that all processing of the structure be carried out in a multi-chamber system like that shown in FIG. 1D. So long as the integrity of the solid condensate layer is preserved, the structure processing can proceed in any suitable equipment, and can be carried out in separate chambers. The material deposition process can be enabled by any suitable deposition technique, with vapor processing techniques preferred. Sputtering, evaporation, chemical vapor deposition, plasma deposition, or other suitable process can be employed.

As shown in FIG. 1D, whatever material deposition process is employed, such results in blanket coverage of the structure 15 and the patterned condensate layer 30. It is therefore preferred that the material deposition technique and the material constituents produced for deposition enable substantially uniform and conformal coverage of the structure and the patterned condensate layer. It is also preferred that the exposed surface regions of the structure be characterized as good adhering surfaces for the depositing material as the deposition is initiated and progresses.

Once a blanket layer of material is deposited on the structure and patterned condensate layer, the condensate layer and upper deposited layer are then removed to lift-off the regions of deposited material located atop the condensate layer. During this removal process, the deposited material on the exposed regions of the structure remains in place. As a result, the condensate lift-off enables production of patterns of deposited material in an arrangement corresponding to the prior local removal of the condensate layer.

Figure 1E:
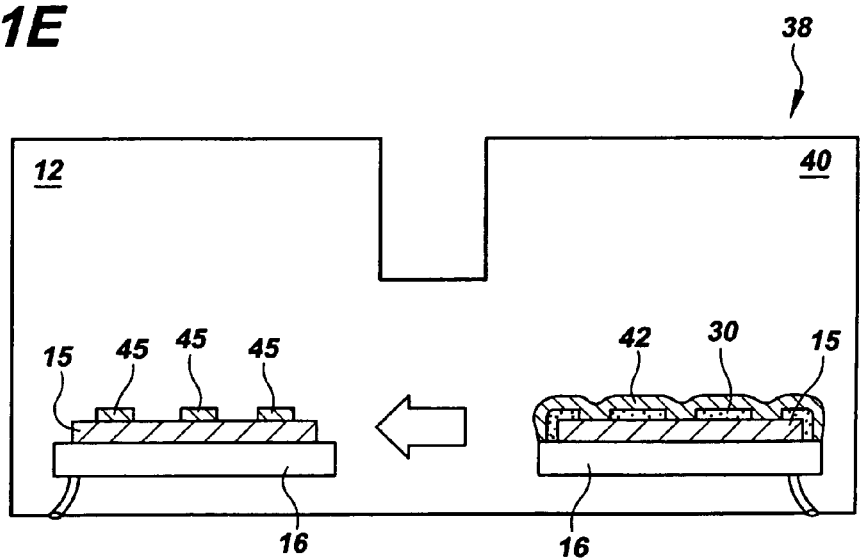

As shown in FIG. 1E, the removal of the condensate layer 42 can be carried out in situ in a selected processing chamber. For example, the structure can be positioned in the first processing chamber 12 and the temperature and pressure conditions of that chamber adjusted such that the condensate layer 30 and regions of the material layer 42 atop the condensate layer are removed. Patterned regions 45 of material are thereby produced on the structure 15.

In accordance with the invention, the lift-off of the solid condensate layer and upper material layer can be accomplished by any suitable technique. Liquid or vapor phase processing can be employed as appropriate. In one particularly advantageous technique, lift-off of the solid condensate layer and upper material layer is affected by conversion of the condensate layer from the solid phase to the vapor phase in a process reversing the vapor-to-solid condensate formation of the layer. Such a solid-to-vapor process minimizes residue formation on the structure, minimizes liquid surface tension effects on the structure, and minimizes waste products. For example, given a solid ice condensate layer, in situ sublimation of the layer can be accomplished by increasing the structure temperature to a temperature at which the condensate layer sublimes. This in situ sublimation process can be controlled to enable a partial thickness reduction and/or complete layer removal.

Given the example solid ice condensate formation process described previously, in which an ice condensate layer was formed at a structure temperature of less than about 130 K and a pressure of less than $10^{-4}$ T, an increase in the structure temperature to about 180 K at the pressure of less than $10^{-4}$ T is found to totally remove an ice condensate layer and enable lift-off of the upper material layer.

It is to be recognized that the sublimation energy of a solid condensate, as a function of temperature, for a given condensate directly impacts the practical ability to sublime a layer of the condensate. For example, the rate of sublimation, $\Phi(T)$, as a function of temperature, T, for a solid ice condensate layer, can be expressed as:

$$\Phi(T)=CT^{3.5}\exp(-E_{sub}/kT), \quad (1)$$

where C is an empirically determined constant, $E_{sub}$ is the sublimation energy, given as 0.45 eV for solid ice, and k is Boltzmann's constant. The constant C was empirically determined to be about $1.8 \times 10^{21}$ molecules/(cm$^2$s$^{3.5}$). This leads to the conclusion that at a temperature of about 128 K, a layer of solid ice condensate sublimes at a rate of only about 0.3 monolayers/hour. This expression can be employed to determine if sublimation of a solid ice condensate layer can be carried out at a temperature and/or during a time interval that is practical for a given process application.

It is further recognized that for some applications, in the course of sublimation of a condensate layer an upper layer may trap the condensate such that sublimation cannot proceed. For such a circumstance, it can be preferred to provide access apertures in the upper layer or the substrate such that sublimation of the condensate layer can be enabled. The complete sublimation of a solid condensate layer in a multi-layer system can then be accomplished.

Where the sublimation temperature or times characteristic of a given solid condensate layer are not practical for a given application, the solid condensate layer can be removed by a process other than sublimation. For example, vapor processing, wet processing, or other conventional layer removal process can be employed. In addition, an energetic beam, e.g., an electron beam, can be scanned across the layer to fully remove all portions of the layer.

For many applications, however, it can be preferred that the solid condensate layer be removed, as well as formed by, solid-to-vapor and vapor-to-solid processes, respectively. Such enables an entirely dry deposition and removal cycle that does not require conventional processes such as liquid spinning, baking, wet processing and other such processes. The need for disposal of solvents and other environmentally harmful chemicals can therefore be avoided.

But it is recognized in accordance with the invention that under certain circumstances, and for some applications, it can be preferred to employ an alternative solid condensate removal process in addition to or instead of an all-dry sublimation process. For example, in the case of a solid ice condensate layer, removal of the layer can be accomplished by simply melting to the liquid phase, and/or rinsing or other removal process alternative to or in addition to sublimation. It is recognized that during a sublimation process there may be a formation of residue, such as minute deposits of the material layer, on the underlying structure. In such situation, it is preferred that a rinsing or cleaning technique be employed for removing such residue after the lift-off process is complete.

In an experimental example of a lift-off technique provided by the invention, a 20 nm-thick solid ice condensate layer was formed on a silicon substrate in the manner described above. An electron beam of 30 KeV was employed for locally removing a linear path of the ice condensate layer with a total dose of 4.5 µC/cm. After local ice condensate layer removal, a Cr layer of 8 nm in thickness was blanket-deposited over the substrate and patterned ice condensate layer by sputtering in a chamber like that of FIG. 1D. During the sputter deposition step, the temperature and pressure of the process chamber were maintained at about 128 K and $10^{-4}$ T to retain the integrity of the ice condensate layer.

Lift-off of the patterned ice condensate layer and upper material layer was then carried out by subliming the ice condensate layer. This resulted in production of a 24 nm-wide Cr line on the silicon substrate. In a similar process for which a 20 KeV electron beam was employed to deliver a 4.4 µC/cm dose of electrons for local removal of a linear path in the ice condensate layer, a 17 nm-wide Cr line was produced on the silicon substrate. In a further experimental example, the ice condensate layer was locally removed in a square region by a 30 KeV, 10 pA Ga$^+$ ion beam, at a dose of $3.5 \times 10^3$ µC/cm$^2$. After Cr blanket metallization and sublimation lift-off, formation of 1 µm square Cr pads were formed.

These examples demonstrate that both relatively large scale features as well as extremely fine linewidths can be achieved by the condensate lift-off process of the invention. With this wide range of patterning, many materials and applications can be addressed. Specifically, the material layer to be blanket-deposited for lift-off can be provided as any suitable combination of constituents. Metallization is particularly well-addressed by the lift-off process of the invention, and therefore, an electrically conducting material, e.g., gold, silver, palladium, chromium, aluminum, or other selected conducting material can be advantageously employed. The invention is not limited to metallization however; all that is required is the lift-off of a material layer and underlying patterned solid condensate layer.

Further, the lift-off process of the invention can be carried out on any suitable structure and structural configuration. No particular structure regularity or planarity is required. The solid condensate deposition, processing, and removal techniques of the invention can be applied to two-dimensional, three-dimensional, planar, cylindrical, or other-shaped structures, and is in general, topology and topography independent. Microelectromechanical systems (MEMS), nanometric systems, and micro- and nano-structures are therefore well-addressed by the solid condensate lift-off technique of the invention.

Compared with conventional polymer-based photoresist processing, the solid condensate lift-off process of the invention does not require liquid spinning or baking, and does not require photoresist development steps. All local condensate layer removal, material deposition, and condensate lift-off steps can be carried out in a single process chamber environment with high resolution in situ monitoring, e.g., by SEM and/or ion beam imaging. The condensate can be locally patterned by any in a large selection of energetic beams, including conventional UV beams and electron beams. The condensate layer can be formed with any selected vapor that condenses to the solid phase and that provides material and chemical characteristics suitable for a given application. Lift-off of the condensate layer can be carried out by any suitable technique, and advantageously, can be removed by sublimation. This eliminates the need for solvents, and inhibits deleterious device effects, due to, e.g., liquid flow, contamination, and surface tension, that are commonly a challenge for liquid processing of micro- and nano-scale structures.

It is recognized, of course, that those skilled in the art may make various modifications and additions to the processes of the invention without departing from the spirit and scope of the present contribution to the art. Accordingly, it is to be understood that the protection sought to be afforded hereby should be deemed to extend to the subject matter of the claims and all equivalents thereof fairly within the scope of the invention.

We claim:

1. A method for forming a nano-patterned material layer on a structure, comprising:
    condensing a vapor to an amorphous solid water condensate layer on a surface of the structure;
    localized removal of at least one selected nanometric region of the condensate layer by directing a focused electron beam of energy at the selected region, exposing the structure at the selected region;
    depositing a material layer on top of the solid condensate layer and on the exposed structure at the selected region; and
    removing the solid condensate layer and regions of the material layer that were deposited on top of the solid condensate layer, leaving a patterned material layer on the structure.

2. The method of claim 1 wherein the vapor to be condensed to a solid condensate layer is injected as a vapor into a process chamber in which the structure is provided.

3. The method of claim 1 wherein the vapor to be condensed to a solid condensate layer is supplied from a vapor source.

4. The method of claim 1 wherein the vapor to be condensed to a solid condensate layer is supplied from a liquid source.

5. The method of claim 1 wherein the vapor to be condensed to a solid condensate layer is supplied from a solid source.

6. The method of claim 1 wherein the vapor to be condensed to a solid condensate layer comprises water vapor.

7. The method of claim 1 wherein the solid water condensate layer comprises ice.

8. A method for forming a nano-patterned material layer on a structure, comprising:
    condensing a vapor to an amorphous solid condensate layer on a surface of the structure;
    localized removal of at least one selected nanometric region of the condensate layer by directing a focused electron beam, characterized by a beam energy of between about 1 keV and about 30 keV, at the selected region;
    depositing a material layer on top of the solid condensate layer and on the exposed structure at the selected region; and
    removing the solid condensate layer and regions of the material layer that were deposited on top of the solid condensate layer, leaving a patterned material layer on the structure.

9. The method of claim 1 further comprising controlling temperature and pressure conditions local to the structure surface to cause condensation of the vapor to the solid condensate layer on the structure surface.

10. The method of claim 9 wherein controlling the temperature condition local to the structure surface comprises providing the structure on a structure holder that is configured to control temperature of the structure.

11. The method of claim 9 wherein the controlled pressure condition local to the structure surface is characterized as a vacuum condition.

12. The method of claim 9 wherein the vapor to be condensed to a solid condensate layer comprises water vapor and the pressure local to the structure is controlled to be less than about $10^{-4}$ T.

13. The method of claim 9 wherein the vapor to be condensed to a solid condensate layer comprises water vapor and the temperature local to the structure is controlled to be less than about 180 K.

14. The method of claim 9 wherein the vapor to be condensed to a solid condensate layer comprises water vapor and the temperature local to the structure is controlled to be less than about 130 K.

15. The method of claim 1 wherein the solid condensate layer includes an additive selected to optimize absorption of the beam of energy by the solid condensate layer.

16. The method of claim 1 wherein the localized removal of at least one selected region of the condensate layer comprises localized conversion of the solid condensate to a vapor at the selected region.

17. The method of claim 16 wherein the localized conversion of the solid condensate to a vapor comprises localized sublimation of the solid condensate layer at the selected region.

18. A method for forming a nano-patterned material layer on a structure, comprising:
    condensing a vapor to an amorphous solid condensate layer on a surface of the structure;
    localized removal of at least one selected nanometric region of the condensate layer by directing each beam in a plurality of beams of energy to a corresponding selected region;
    depositing a material layer on top of the solid condensate layer and on the exposed structure at the selected region; and
    removing the solid condensate layer and regions of the material layer that were deposited on top of the solid condensate layer, leaving a patterned material layer on the structure.

19. The method of claim 18 wherein the beam of energy comprises an electron beam.

20. The method of claim 18 wherein the beam of energy comprises an ion beam.

21. The method of claim 18 wherein the beam of energy comprises an atomic beam.

22. The method of claim 18 wherein the beam of energy comprises an optical beam.

23. The method of claim 18 wherein the beam of energy comprises an UV beam.

24. The method of claim 18 wherein the beam of energy comprises an X-ray beam.

25. The method of claim 18 wherein the beam of energy comprises a molecular beam.

26. The method of claim 1 wherein the localized removal of at least one selected region of the condensate layer comprises scanning of the electron beam on the solid condensate layer along a path corresponding to a desired pattern in the material layer.

27. The method of claim 1 wherein the material layer is deposited by sputtering.

28. The method of claim 1 wherein the material layer is deposited by vapor deposition.

29. The method of claim 1 wherein the material layer is deposited by chemical vapor deposition.

30. The method of claim 1 wherein the material layer is deposited by evaporation.

31. The method of claim 1 wherein the material layer is deposited by plasma deposition.

32. The method of claim 1 wherein the material layer comprises an electrically conducting material.

33. The method of claim 32 wherein the material layer comprises chromium.

34. The method of claim 32 wherein the material layer comprises gold.

35. The method of claim 32 wherein the material layer comprises aluminum.

36. The method of claim 32 wherein the material layer comprises silver.

37. The method of claim 32 wherein the material layer comprises palladium.

38. The method of claim 1 wherein the structure comprises a silicon substrate.

39. The method of claim 1 wherein the material layer is deposited as a blanket layer over the solid condensate layer and the exposed structure at the selected region.

40. The method of claim 1 further comprising controlling temperature and pressure conditions local to the structure during localized removal of the solid condensate layer and deposition of the material layer to substantially maintain stability of the solid condensate layer.

41. The method of claim 1 wherein removal of the solid condensate layer and regions of the material layer that were deposited on the solid condensate layer comprises conversion of the solid condensate layer to a vapor.

42. The method of claim 41 wherein conversion of the solid condensate layer to a vapor comprises heating the structure to convert the solid condensate layer to a vapor.

43. The method of claim 40 wherein conversion of the solid condensate layer to a vapor comprises sublimation of the condensate layer.

44. The method of claim 1 wherein removal of the solid condensate layer and regions of the material layer that were deposited on the solid condensate layer comprises a process of lift-off of the material layer regions as the solid condensate layer is removed.

45. The method of claim 1 wherein the vapor condensation, the localized removal of the solid condensate layer, the material layer deposition, and the solid condensate layer removal are carried out in a common processing chamber unit.

46. The method of claim 1 wherein the patterned material layer is characterized by a pattern linewidth less than about 1 µm.

47. The method of claim 46 wherein the patterned material layer is characterized by a pattern linewidth less than about 25 nm.

48. The method of claim 1 wherein directing a focused electron beam at the selected region comprises scanning the electron beam along the selected region.

49. The method of claim 1 wherein the focused electron beam is characterized by a beam energy of between about 1 keV and about 30 keV.

50. The method of claim 49 wherein the focused electron beam is characterized by a beam of energy of about 5 keV.

51. The method of claim 1 wherein the focused electron beam is characterized by a beam diameter of about 5 nm.

52. The method of claim 1 further comprising draining electron beam charge from the structure, during localized region removal, by electrically grounding the structure during localized region removal.

53. A method for forming a nano-patterned material layer on a structure, comprising:
   condensing a vapor to an amorphous solid water condensate layer on a surface of the structure at a condensation rate of less than about 25 nm/sec;
   localized removal of at least one selected nanometric region of the condensate layer by directing a beam of energy at the selected region;
   depositing a material layer on top of the solid condensate layer and on the exposed structure at the selected region; and
   removing the solid condensate layer and regions of the material layer that were deposited on top of the solid condensate layer, leaving a patterned material layer on the structure.

54. A method for forming a nano-patterned material layer on a structure, comprising:
   condensing a vapor to an amorphous solid water condensate layer on a surface of the structure at a local pressure of less than about $10^{-6}$ T and a local temperature of less than about 130 K;
   localized removal of at least one selected nanometric region of the condensate layer by directing a beam of energy at the selected region;
   depositing a material layer on top of the solid condensate layer and on the exposed structure at the selected region; and
   removing the solid condensate layer and regions of the material layer that were deposited on top of the solid condensate layer, leaving a patterned material layer on the structure.

55. The method of claim 54 wherein the local pressure is less than about $10^{-4}$ T and the local temperature is no more than about 128 K.

56. The method of claim 8 wherein the vapor to be condensed to a solid condensate layer comprises an inert gas.

57. A method for forming a nano-patterned material layer on a structure, comprising:
   condensing a vapor to an amorphous solid condensate layer on a surface of the structure;
   localized removal of at least one selected nanometric region of the condensate layer by directing a focused electron beam, characterized by a beam diameter of about 5 nm, at the selected region;
   depositing a material layer on top of the solid condensate layer and on the exposed structure at the selected region; and
   removing the solid condensate layer and regions of the material layer that were deposited on top of the solid condensate layer, leaving a patterned material layer on the structure.

* * * * *